United States Patent
Kurapov

(10) Patent No.: US 12,392,022 B2
(45) Date of Patent: Aug. 19, 2025

(54) COATED TOOL FOR MACHINING OF DIFFICULT TO PROCESS MATERIALS

(71) Applicant: Oerlikon Surface Solutions AG, Pfäffikon, Pfäffikon (CH)

(72) Inventor: Denis Kurapov, Walenstadt (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 703 days.

(21) Appl. No.: 17/429,712

(22) PCT Filed: Feb. 10, 2020

(86) PCT No.: PCT/EP2020/053327
§ 371 (c)(1),
(2) Date: Aug. 10, 2021

(87) PCT Pub. No.: WO2020/165093
PCT Pub. Date: Aug. 20, 2020

(65) Prior Publication Data
US 2022/0098721 A1    Mar. 31, 2022

(30) Foreign Application Priority Data
Feb. 11, 2019   (DE) ..................... 10 2019 103 363.2

(51) Int. Cl.
C23C 14/06    (2006.01)
B23C 5/00    (2006.01)
C23C 14/02    (2006.01)

(52) U.S. Cl.
CPC .......... *C23C 14/0641* (2013.01); *B23C 5/006* (2013.01); *C23C 14/024* (2013.01);
(Continued)

(58) Field of Classification Search
None
See application file for complete search history.

(56) References Cited

U.S. PATENT DOCUMENTS 8,394,513 B2 * 3/2013 Van Den Berg ........ C23C 16/24
51/307
2006/0147728 A1 7/2006 Shen et al.
(Continued)

FOREIGN PATENT DOCUMENTS

DE    112009001396 T5    4/2011
EP    3056587 A1    8/2016
(Continued)

OTHER PUBLICATIONS

Durand-Drouhin et al., Mechanical properties and failure modes of TiAl(Si)N single and multilayer thin films, Surface and Coatings Technology, vols. 163-164, Jan. 30, 2003, pp. 260-266.
(Continued)

*Primary Examiner* — Kim S. Horger
(74) *Attorney, Agent, or Firm* — Christian S. Hans; Bret E. Field; Bozicevic, Field & Francis LLP

(57) ABSTRACT

The present invention relates to a tool (100) for machining workpieces (200), comprising a surface (110) which is at least partially covered by a PVD deposited wear-resistant coating (120), said wear resistant coating (120) comprising one or more wear-resistant layers (121, 122), the coating having a modulus of elasticity, E, which is in a range 300 GPa≤E<350 GPa, and further having a hardness, H, which is greater than 30 GPa.

14 Claims, 7 Drawing Sheets

Figure 1:
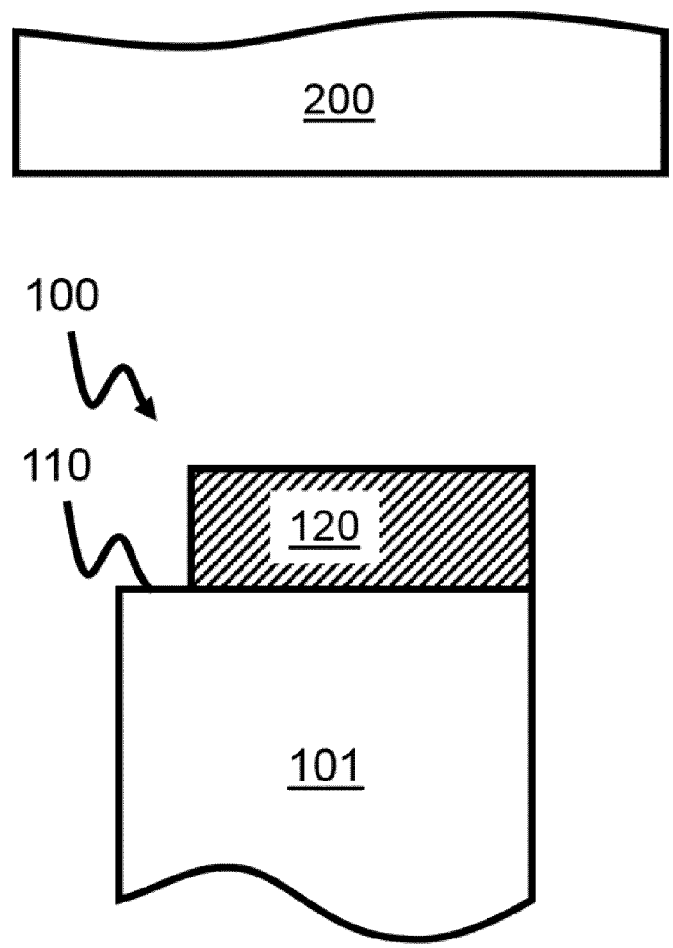

(52) U.S. Cl.
CPC ...... *B23C 2224/14* (2013.01); *B23C 2224/24* (2013.01); *B23C 2228/08* (2013.01); *B23C 2228/10* (2013.01)

(56) References Cited

U.S. PATENT DOCUMENTS

| | | | |
|---|---|---|---|
| 2011/0083283 A1 | 4/2011 | Valldeperas-Morell et al. | |
| 2015/0050490 A1 | 2/2015 | Kumar et al. | |
| 2018/0023194 A1 | 1/2018 | Pitonak et al. | |
| 2018/0245201 A1* | 8/2018 | Park | C23C 14/548 |

FOREIGN PATENT DOCUMENTS

| | | | | |
|---|---|---|---|---|
| JP | 2014015636 A * | 1/2014 | | |
| JP | 2017133064 A | 8/2017 | | |
| WO | WO-03085152 A2 * | 10/2003 | ......... | C23C 14/0036 |
| WO | WO2014049105 A1 | 4/2014 | | |
| WO | WO2016112417 A1 | 7/2016 | | |

OTHER PUBLICATIONS

Office Action for German Patent Application No. 10 2019 103 363.2 dated Nov. 21, 2019, and its English summary, 8 pages.
International Preliminary Report on Patentability for International Patent Application No. PCT/EP2020/053327, 10 pages.
Office Action for European Application No. 20706131.8 mailed on Nov. 17, 2023, 7 pages.
Office Action for Japan Patent Application No. 2021-546783, mailed Feb. 6, 2024, and its English translation, 18 pages.
Durand-Drouhin et al., Mechanical properties and failure modes of TiAl(Si)N single and multilayer thin films, Surface and Coatings Technology, 2003, vol. 163-164, p. 260-266.
Office Action for Japan Patent Application No. 2021-546783, mailed Aug. 27, 2024, and its English translation, 9 pages.

* cited by examiner

COATED TOOL FOR MACHINING OF DIFFICULT TO PROCESS MATERIALS

The present invention relates to a tool according to the independent claim 1.

Machining tools used for cutting, boring, grinding, shearing or other forms of deformation are subject to wear, in particular when processing materials which possess a high hardness or strength, such as nickel based alloys (e.g. Inconel 718), stainless steel, in particular austenitic stainless steel, or steel with certain amounts of strength improving additives like chromium, molybdenum, nickel, manganese, carbon, nitrogen or oxygen. In order to increase endurance of the machining tools, wear resistant coatings can be deposited on the surface of the machining tools.

These coatings each have an individual combination of mechanical properties, in particular regarding elastic modulus (also referred to as Young's Modulus or E-Modulus) and hardness, which may enable enhancing performance and life time of these tools. The life time may also be referred to as service life or lifespan in the following.

In general, using coatings according to the present invention involves a considerable advantage for machining, especially milling of materials, in particularly the difficult to cut materials, which are commonly prone to produce adhesive wear of the tool.

A large variety of coatings are commonly used for improving tool performance during machining of materials. However, the resistance against wear of these known tools is still unsatisfactory.

It is therefore the task of the present invention to provide a tool which at least partially eliminates the above-mentioned disadvantages, has a longer service life and enables improved machining of workpieces.

The inventor found that surprisingly high improvements regarding reduction of wear as well as enhancement of general tool performance are attained by coating the tool with a coating exhibiting hardness values, H, higher than 30 GPa (i.e. H>30 GPa) and elastic modulus values, E, in a range between 300 GPa and 350 GPa (i.e. 300≤E<350 GPa).

The preceding task is solved by a device with the characteristics of claim 1.

According to the invention, a tool for machining workpieces is suggested, comprising a surface which is at least partially covered by a wear-resistant coating, said wear resistant coating having a modulus of elasticity which is in a range between 300 and 350 GPa, and further having a hardness, H, which is greater than 30 GPa (i.e. H>30 GPa).

It is understood that the specific values regarding the modulus of elasticity and the hardness of the wear-resistant coating refer in particular to values measured at standard conditions, i.e. room ambient temperature, room ambient pressure, etc. (in other words: normal ambient conditions).

As will be presented in representative examples, the combination of these two mechanical properties surprisingly results in an increased service life of the tool and allows a higher quality of the machining. Provided that the hardness is larger than 30 GPa, coatings with a modulus of elasticity between 300 and 350 GPa show a significantly better performance in comparison with those that are below or above that range.

Machining can at least include turning, drilling, countersinking, reaming, milling, planing, shaping, broaching, sawing, filing, rasping, brushing, scraping or chiselling. The tool according to the invention is particularly suitable for end-milling materials that are difficult to process, in particular difficult to cut.

The modulus of elasticity or Young's modulus, tensile modulus, coefficient of elasticity, or elongation modulus, is a material parameter. Within the linear-elastic behaviour, the modulus of elasticity indicates the proportional relationship between stress and strain during the deformation of a solid body. The modulus of elasticity is thus the proportionality constant of Hooke's law.

The hardness is the mechanical resistance of a material to the mechanical penetration of another body and can be determined in various ways. The hardness value can be based on testing the Vickers hardness, but the scope of the invention shall not be limited thereto. An expert can draw conclusions from the Vickers hardness to other hardness scales, such as the Rockwell hardness.

The surface according to the invention is made of the same material that the tool is made of. In the simplest case, the surface is therefore an uncoated surface. This does not exclude a layer of oxidation that is always present whenever a surface gets into contact with ambient air. The rest of the tool usually is made of at least one bulk material.

It may be provided that the area covered by the wear-resistant coating is located where the tool comes into mechanical contact with the workpiece. This provides the advantage that the tool does not have to be coated entirely. Coating the entire surface of the tool may result in significantly higher cost, as for most deposition processes, the substrate (the tool in this case) has to be fixed by a holder. Where the holder grips the tool, no layer can be deposited, so the holder must be moved to another position cover the whole tool with the coating. Therefore, depositing the coating only where the tool comes into contact with the workpiece reduces the manufacturing costs while maintaining functionality.

The inventive covering with a wear-resistant layer means that this layer is firmly attached to the tool and is not easily removed, especially by not using the tool in the intended manner.

Furthermore, a wear-resistant coating according to the invention may comprise one or more wear-resistant layers, each one of the wear-resistant layers having a modulus of elasticity which is in a range between 300 and 350 GPa, and further having a hardness which is greater than 30 GPa.

This provides the advantage that properties of different materials can be combined, e.g. their chemical resistance, which ultimately leads to a higher service life. Further, particularly mode I fracturing (opening mode) can be stopped at the interface between two layers.

It can be advantageous that an adhesive layer is applied between the surface and the wear-resistant coating, wherein the adhesive layer improves the adhesion of the wear-resistant coating to the surface and has an adhesion layer thickness between 10 nm and 1 µm, in particular wherein the adhesion layer thickness is smaller than that of the wear-resistant coating, preferably at least 3 times.

This may be particularly important whenever the material of the tool and/or its mechanical properties deviate significantly from the wear-resistant coating. The adhesion of the wear-resistant coating may be particularly improved by an adhesive layer made of TiN or AlN when the wear-resistant coating is an N coating. An improved adhesion also results in a higher service life of the tool.

Adhesive layers with a thickness between 10 nm and 1 µm or at least three times lower than the wear resistant coating possess the advantage of increasing the adhesion of the wear-resistant coating while not reducing the functionality (wear-resistance) of the wear-resistant coating. A thinner layer thickness may result in a lower adhesion and a thicker thickness may result in a loss of functionality of the wear-resistant coating. Thus, the advantage of an improved machining performance can be obtained.

Furthermore, it is conceivable that the adhesive layer has an adhesive layer thickness between 10 nm and 0.5 µm, in particular between 10 nm and 0.25 µm. Thereby, the time needed for the deposition of the adhesive layer is further reduced and thus the manufacturing cost reduced, while the functionality is maintained.

Also, it may be provided that wear-resistant coating comprises two or more wear-resistant layers, wherein at least two of the two or more wear-resistant layers are made of materials having the same elements but differing in chemical composition. This provides the advantage that the deposition process can be performed more flexibly. E.g., it might be required that for a better adhesion of the coating to the tool, that the layer deposited directly on the tool requires a slightly higher amount of one of the materials than the layer that comes into contact with the workpiece. This also allows for an improved customization of the wear-resistant coating to the surface of the tool and therefore for a higher service life and better machining properties. In the context of the invention, a different chemical composition may in particular mean both a composition in which the elements concerned are present in different amounts and a composition in which the elements concerned differ only in their structural arrangement.

Furthermore, it may be advantageously provided that the wear-resistant coating comprises two or more wear-resistant layers, wherein at least two of the two or more wear-resistant layers are made of materials having the same elements and same chemical composition but differing in mechanical properties such as modulus of elasticity and/or hardness. This provides the advantage that the wear-resistant layers can be adjusted to a particular usage more flexibly. E.g., it might be required that a certain workpiece requires a harder wear-resistant coating for faster machining, whereas the service life could be improved by a lower hardness. It may then be provided to combine a wear-resistant coating that has a lower hardness in the layer that is in contact with the surface of the tool and a higher hardness in the layer that can be brought into mechanical contact with the workpiece. Thus, by combining different mechanical properties, a longer service life and better machining properties can be achieved. The different mechanical properties can preferably be specifically adjusted, in particular by modifying coating parameters such as temperature, pressure, coating duration, bias voltage, discharge current or the like It is conceivable that the wear-resistant coating comprises two or more layers, wherein at least two of the two or more wear-resistant layers are made of different materials. By depositing more than more than one wear-resistant layers, a longer service-life and improved machining can be obtained, e.g. by adjusting the layer facing the workpiece to the properties of the workpiece and the layer facing the surface of the tool to its properties.

It is also feasible that the wear-resistant coating comprises at least one TiAlN layer (in the context of the present invention a TiAlN layer preferably is a titanium aluminium nitride layer having chemical composition in atomic percentage of $Ti_{1-q}Al_qN$ with $0<q\leq0.5$) or at least one TiSiN layer or at least one AlCrN layer. Titanium aluminium nitride (TiAlN) and aluminium titan nitride (AlTiN) stands for a group of metastable hard coatings consisting of the metallic elements aluminium and titanium, and nitrogen. The mechanical properties of TiAlN layers and AlTiN layers are particularly well suited for machining of abrasive materials, which in turn provides a longer service life and improved machining. Titanium silicon nitride (TiSiN) stands for a group of hard coatings, which possess the advantage of high edge retention and corrosion resistance on machine tooling, which also ultimately improves the service life and machining. Aluminium chrome nitride (AlCrN) layers possess an outstanding resistance against thermal shocks and a high thermal durability. This also has the advantage of a longer service life and improved machining.

According a preferred embodiment the wear-resistant coating is a double layer comprising:
an AlTiN layer and a TiSiN layer, or
an AlTiN layer and an AlCrN layer.

It is advantageous that the wear-resistant coating comprises at least one nitride layer or at least one carbonitride layer or at least one carboxynitride layer or at least one oxynitride layer, in some cases, for example by end-milling of difficult-to-cut materials it may be preferred using only or mainly nitride layers. Nitride layers offer the advantage of hardening most surfaces, so that a higher wear-resistance can be obtained. Carbonnitride layers offer a low friction coefficient and a high hardness. Carboxynitride layers also offer a low friction coefficient combined with a low intrinsic stress in the coating. Oxynitride layers possess a good chemical resistance. All of these alternatives or combinations thereof provide the advantage of increasing service life and/or improving machining.

Furthermore, it may be advantageously provided that the chemical composition of at least one wear-resistant layer comprised in the wear-resistant coating comprises at least two metals, in particular aluminium and titanium. Coatings containing at least two metals possess favourable mechanical properties for machining compared to coatings with no or only one metal containing coatings. Aluminium and titanium showed particularly good performance in terms of service life and machining quality.

Furthermore, it is conceivable that the chemical composition of at least one layer comprised in the wear-resistant coating is $Al_xTi_{1-x}N$, wherein x has a value between 0.5 and 0.9 (i.e. $0.5<x\leq0.9$) preferably between 0.6 and 0.8 (i.e. $0.6\leq x\leq0.8$). AlTiN coatings with the properties according to the invention possess a long service life and good machining quality. $Al_xTi_{1-x}N$ coatings with x in the range $0.5<x\leq0.9$, in particular in the range $0.6\leq x\leq0.8$ show particularly favourable properties, wherein coatings with x=0.66 are particularly preferred.

It is conceivable that the chemical composition of at least one wear-resistant layer comprised in the wear-resistant coating comprises at least titanium and silicon, in particular additionally nitrogen. Wear-resistant coating comprising titanium and silicon possess excellent adhesion of the coating to the surface of the tool and/or an adhesion layer. Further, an additional incorporation of nitrogen in the wear-resistant layer improves the chemical resistance of the coatings. In both cases, the service life is prolonged.

It is also feasible that the wear-resistant coating has a layer thickness of 0.5 to 20 µm, in particular between 1 and 7 µm or 5 and 20 µm. The thickness of a wear-resistant coating has a significant effect on the service life. While coatings that are too thin result in a relatively fast wear, coatings with a very high thickness may easily ablate. Wear resistant coatings with the properties according to the invention show a particularly good service life when the layer thickness is 0.5 to 20 µm, which further improves when the layer thickness is in the range between 1 and 7 µm or 5 and 20 µm. A representative example of this behaviour will be presented in the description of the figures.

Furthermore, it may be advantageously provided that wear-resistant coating has a crystalline or polycrystalline structure. Wear-resistant coatings with crystalline or polycrystalline structure are particularly resistant against abrasive wear, thereby increasing the service life.

It is conceivable that the wear-resistant coating has a variable texture. Texture is the distribution of crystallographic orientations of a polycrystalline sample, wherein variable texture is the presence of at least two predominant orientations. When a variable texture is present in the wear resistant coating, its service life can be increased. It may be provided that when at least two layers are present in the wear-resistant coating, that each layer has a specific texture which differs from the texture of other coatings. This provides more flexibility in the deposition process as well as a prolonged service life of the tool.

It is also feasible that the wear-resistant coating comprises at least one wear-resistant layer exhibiting a cubic phase. Wear-resistant coating comprising a layer with a cubic phase provides the advantage of improved hardness and increased thermal stability.

Furthermore, it may be advantageously provided that the wear-resistant coating and/or at least one wear-resistant layer and/or the adhesive layer is/are deposited with the aid of a physical gas-phase deposition, in particular with an arc evaporation. Coatings and layers deposited with the help of physical gas-phase deposition (PVD) provide the advantage of being harder and more corrosion resistant than coatings applied by the other processes such as electroplating. Furthermore, compared to CVD deposition processes, PVD deposition processes have the advantage that the deposited layers essentially have no tensile residual stress or chlorine residues. In addition, the application temperature is significantly higher in CVD processes, which usually requires undesired post-treatment. The use of arc evaporation in the context of PVD processes, in particular filtered arc deposition, may still further improve the service life of these coatings.

The invention also covers the use of a tool described above for machining difficult to cut materials, in particular for end-milling difficult to cut materials. In the context of the invention, difficult to cut materials can in particular be understood as materials which have a yield strength of more than 180 MPa, preferably more than 500 MPa, in particular more than 1000 MPa, at a temperature of 100° C. and/or a tensile strength of more than 400 MPa, preferably more than 800 MPa, in particular more than 1200 MPa, at a temperature of 100° C.

Furthermore, a use of a tool for machining difficult to cut materials may be provided, wherein the difficult to cut materials are at least partially in the form of stainless steel or nickel-based alloys (i.e. Inconel 718). Additionally, the difficult to cut materials may also be in the form of austenitic stainless steel, or steel with certain amounts of strength improving additives like chromium, molybdenum, nickel, manganese, carbon, nitrogen or oxygen.

Further characteristics and details of the invention result from the subclaims, the description and the drawings. Features and details which have been described in connection with the device conforming to the invention naturally also apply in connection with the system conforming to the invention and/or the procedure conforming to the invention and vice versa in each case, so that with regard to disclosure the individual aspects of the invention are or can always be mutually referred to.

Figure 2:
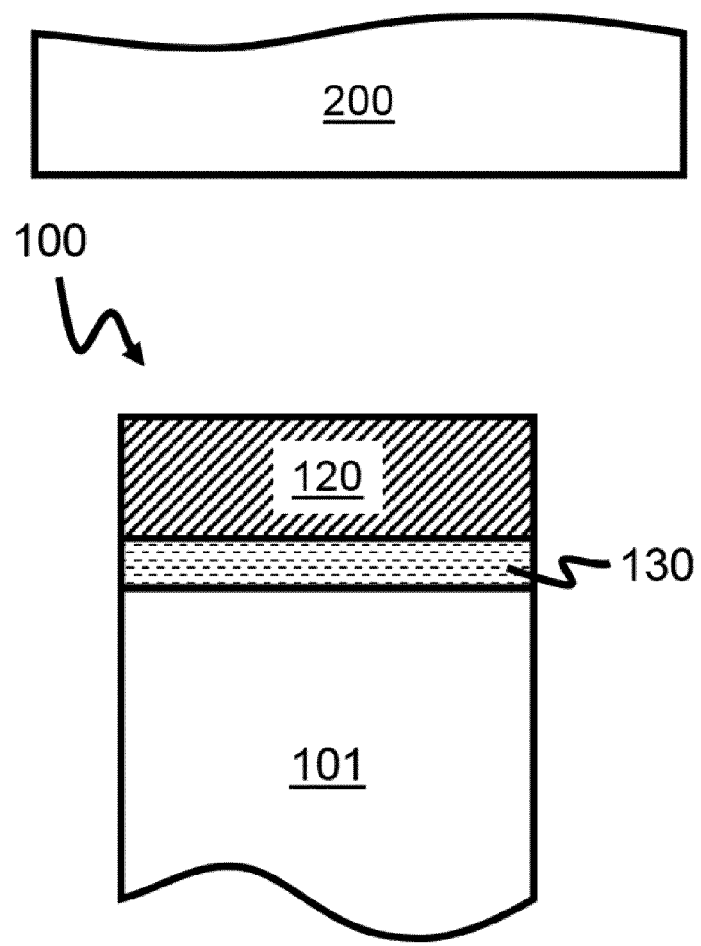
Figure 3:
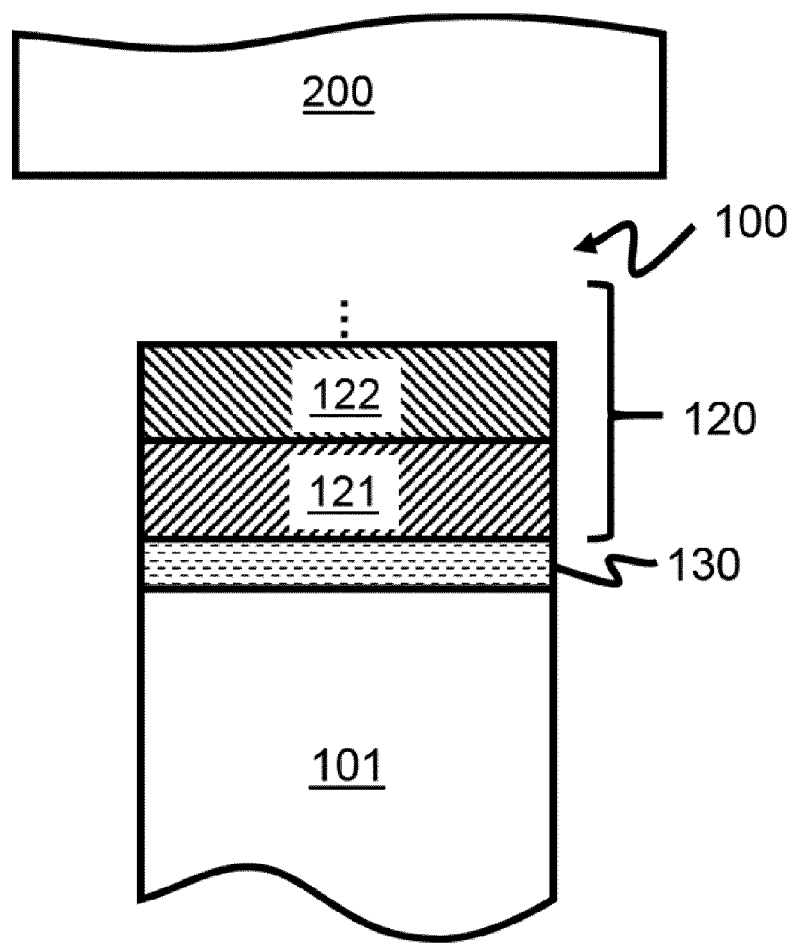
Figure 4:
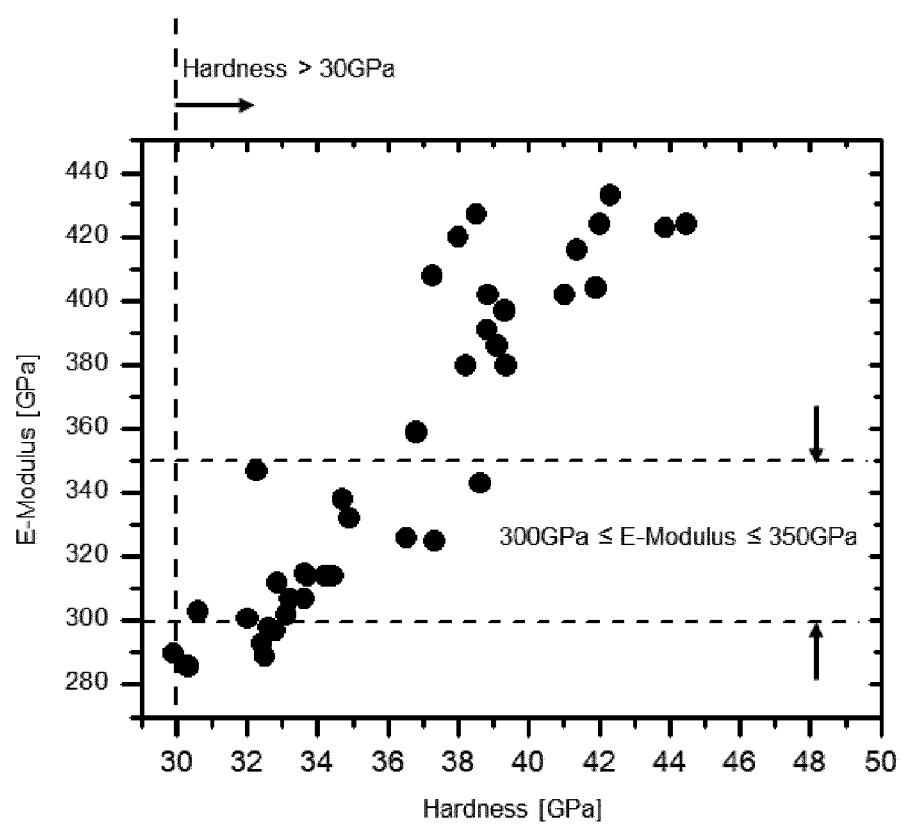

Further measures to improve the invention result from the following description of some examples of the execution of the invention, which are shown schematically in the figures. All features and/or advantages resulting from the claims, the description or the drawings, including design details, spatial arrangements and process steps, may be essential to the invention both in themselves and in various combinations. It should be noted that the figures are only descriptive and are not intended to restrict the invention in any way. They show schematically:

FIG. 1: a schematic view of a tool according to the invention,

FIG. 2: a schematic view of a tool according to the invention, including an adhesion layer FIG. 3: a schematic view of a tool according to the invention, showing two wear-resistant layers FIG. 4: A diagram with a representative collection of coatings where the modulus of elasticity is shown as a function of hardness FIG. 5: A diagram with representative coatings of various thicknesses with mechanical properties according to the state of the art and according to the invention, where the tool life is shown as a function of the thickness of the coating.

Figure 6:
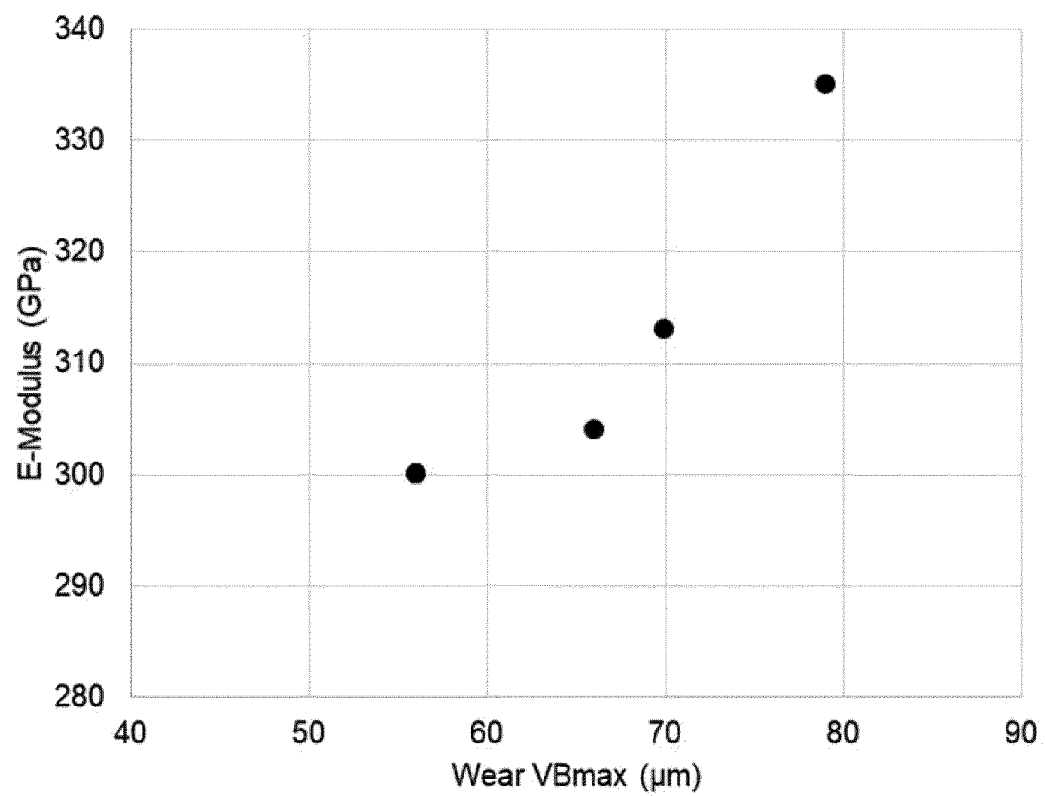

FIG. 6: A diagram with representative coatings with the modulus of elasticity as a function of the wear for machining a workpiece made of 1.3571 SUS316Ti.

Figure 7:
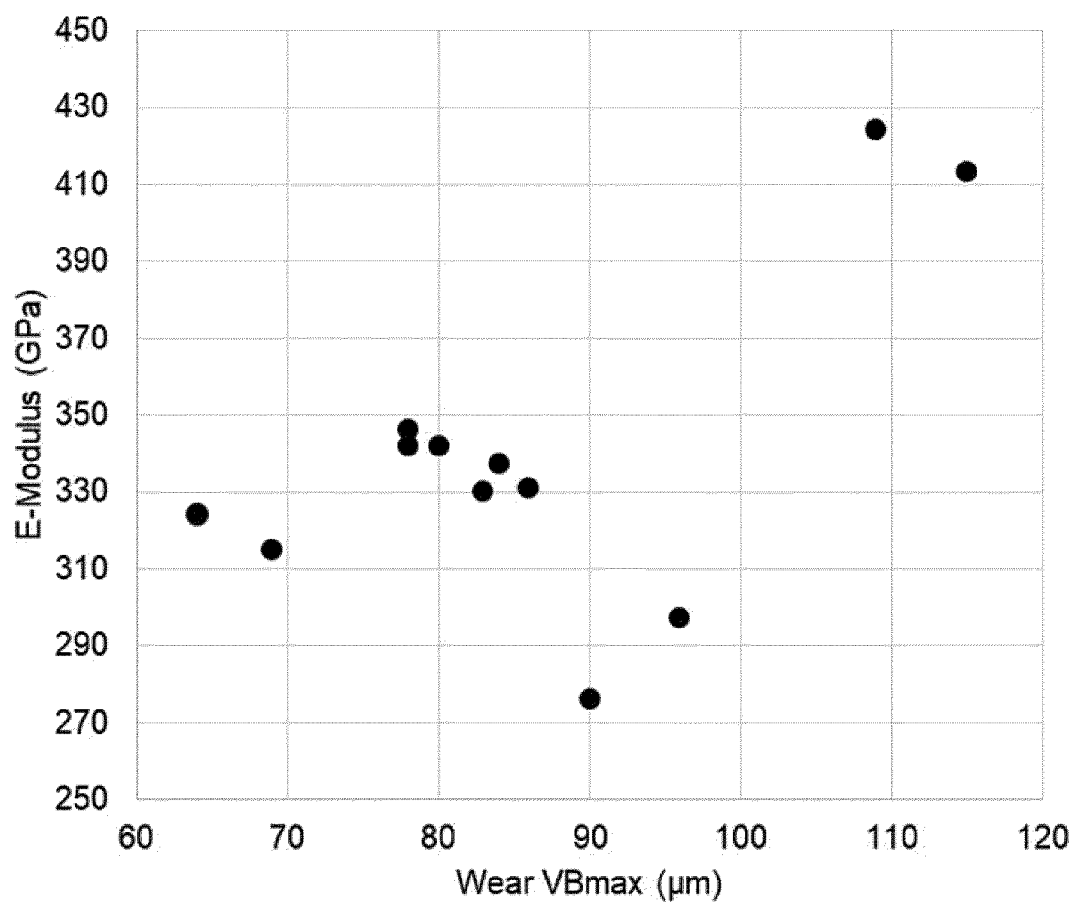

FIG. 7: A diagram with representative coatings with the modulus of elasticity as a function of the wear for machining a workpiece made of Inconel 718.

In FIGS. 1 to 3, schematic views of examples of a tool according to the invention are shown. In the following, FIGS. 4 to 7 show measured properties of representative tools and coatings to illustrate the advantages of a representative set of tools according to the invention. It should be noted that the advantages shown in the presented examples can also be obtained for other coatings with various chemical compositions, layer systems, thicknesses, etc., as long as the properties according to the invention are maintained.

FIG. 1 shows an example of a tool 100 according to the invention for machining a workpiece 200, where the surface 110 is coated at least in parts by a wear-resistant coating 120, said wear resistant coating 120 having a modulus of elasticity E which is in a range between 300 and 350 GPa, and further having a hardness H which is greater than 30 GPa. The tool 100 is made of at least one bulk material 101, which may possess other mechanical properties than the wear-resistant coating 120.

FIG. 2 shows another example of a tool 100 according to the invention, where an adhesive layer 130 is applied between the surface 110 and the wear-resistant coating 120. The adhesive layer 130 improves the adhesion of the wear-resistant coating 120 to the surface 110 and may have an adhesion layer thickness between 10 nm and 1 μm, preferably between 10 nm and 0.5 μm, in particular between 10 nm and 0.25 μm. Alternatively or in addition, the adhesion layer thickness is smaller than that of the wear-resistant coating 120, preferably at least 3 times. A thinner layer thickness may result in a lower adhesion and a thicker thickness may result in a loss of functionality of the wear-resistant coating. Thus, the advantage of an improved machining performance can be obtained.

FIG. 3 illustrates a further example of a tool 100 according to the invention, where, in addition to an adhesive layer 130, a wear-resistant coating 120 comprising two wear-resistant layers 121, 122 is shown. Each one of the wear-resistant layers 121, 122 has a modulus of elasticity E which is in a range between 300 and 350 GPa, and further has a hardness H which is greater than 30 GPa. In this way, properties of different materials can be combined, e.g. their chemical resistance, which ultimately leads to a higher service life.

The following FIGS. 4 to 7) show measured properties of a representative set of tools 100 and coatings to illustrate the advantages of the tool 100 according to the invention.

For all coatings shown in FIG. 4 being in the above-mentioned inventive ranges of elastic modulus and hardness, excellent results in machining, in particular end milling of materials, in particular difficult to cut materials, were obtained. The results were much better than when using the coatings with elastic modulus and hardness without the inventive ranges.

FIG. 4 shows the combination of ranges of values of elastic modulus and hardness of AlTiN coatings deposited by using cathodic arc deposition techniques, thereby using for each coating deposition four AlTi-targets as metal material sources, wherein the targets were operated in a known manner, each one as the cathode in a respective arc evaporator, and nitrogen gas was used as reactive gas. The same trends were also observed for other coating materials, in particular AlCrN, TiSiN and combinations of layers containing at least two metals and/or at least one nitride layer or at least one carbonitride layer or at least one carboxynitride layer or at least one oxynitride layer.

A tool 100 according to the invention may be provided, in which the wear-resistant coating 120 comprises at least one TiAlN layer or at least one TiSiN layer or at least one AlCrN layer. Alternatively or in addition, the wear-resistant coating 120 may comprise at least one nitride layer or at least one carbonitride layer or at least one carboxynitride layer or at least one oxynitride layer. As a further alternative or in addition, the chemical composition of at least one wear-resistant layer 121, 122 comprised in the wear-resistant coating 120 may comprise at least two metals, in particular aluminium and titanium.

It may be provided for a tool 100 according to the invention that the chemical composition of at least one layer 121, 122 comprised in the wear-resistant coating 120 is AlxTi1-xN, wherein x has a value between 0.5 and 0.9, preferably, between 0.6 and 0.8 particularly preferably 0.66. Alternatively or in addition, the chemical composition of at least one wear-resistant layer 121, 122 comprised in the wear-resistant coating 120 may comprise at least titanium and silicon, in particular additionally nitrogen.

For obtaining the different values of elastic modulus and hardness for the coatings as displayed in FIG. 4, the coating parameters (e.g. substrate temperature, bias voltage, etc.) were varied.

All values of elastic modulus and hardness of wear-resistant coatings that have been used in the context of the description of the present invention have been measured by using a Fisherscope H100C. The applied loading force was 10 mNw. The measurements were carried out warranting maximal indentation depth of 1% of the total thickness of the wear-resistant coating 120. For the measurements, polished surfaces of steel samples were coated with the respective coating to be examined, wherein the thickness of the coating was at least 2 μm for making possible a reliable examination of the mechanical properties as well as further coating properties.

For showing the considerable improvement attained by the present invention, the inventor has, among others, deposited different aluminium titanium nitride (AlTiN) coatings by using PVD (physical vapor deposition techniques) of the type arc evaporation.

AlTiN were deposited exhibiting hardness values higher than 30 GPa but not exhibiting elastic modulus values between 300 GPa and 350 GPa at the same time.

Following, some examples of the invention as well as comparative examples will be described in more detail for explaining better the present invention and the technical improvements attained by the present invention. These examples should not be understood as a limitation of the invention but only as showcases of the present invention.

EXAMPLE 1

Non-Inventive Example

A monolayer AlTiN coating according to the state of the art was deposited as a wear-resistant coating on end milling tools by reactive arc cathodic evaporation of AlTi-targets, wherein the targets were operated as cathodes of corresponding arc evaporators for producing vapor of Al and Ti, in the presence of nitrogen gas, which was introduced in the coating chamber as reactive gas for reacting with Al and Ti for forming the AlTiN coating. This AlTiN coating was produced having a chemical composition in atomic percentage corresponding to $Al_xTi_{1-x}N$ with x=0.66, elastic modulus value corresponding to 400 GPa and hardness value corresponding to 40 GPa. The same trends were also observed for other coating materials, in particular AlCrN, TiSiN and combinations of layers containing at least two metals and/or at least one nitride layer or at least one carbonitride layer or at least one carboxynitride layer or at least one oxynitride layer.

End milling tools were coated with coating according to this Example 1, wherein the coating thickness of the AlTiN was varied in order to produce tools having AlTiN coating with coating thickness of 1 μm, 2 μm and 3 μm respectively. The same trend was also observed for other coating materials.

EXAMPLE 2

Inventive Example

A monolayer AlTiN coating according to the present invention was deposited as wear-resistant coating 120 on end milling tools 100 by reactive arc cathodic evaporation of AlTi-targets, wherein the targets were operated as cathodes of corresponding arc evaporators for producing vapor of Al and Ti, in presence of nitrogen gas, which was introduced in the coating chamber as reactive gas for reacting with Al and Ti for forming the AlTiN coating. This AlTiN coating 120 was produced having a chemical composition in atomic percentage corresponding to $Al_xTi_{1-x}N$ with x=0.66, elastic modulus value corresponding to 304 GPa and hardness value corresponding to 35 GPa. The same trends and advantages according to the invention could also be obtained by using another deposition process, such as physical gas-phase deposition.

Both above-mentioned examples 1 and 2 were deposited having a monolayer architecture (i.e. comprising only one layer). However, as mentioned before, the present invention is not limited to wear-resistant coatings 120 having a monolayer architecture but also includes wear-resistant coatings 120 having a multilayer architecture (i.e. comprising two or more layers deposited on one another).

The wear-resistant coatings provided on tools 100, particularly endmills for machining, particularly end-milling, of materials, particularly, difficult-to-cut materials, according to the present invention exhibits elastic modulus and hardness values in the inventive range as mentioned above, i.e. 300 GPa<350 GPa and H>30 GPa. In case a wear-resistant coating 120 according to the invention comprises one or more wear-resistant layers 121, 122, each one of the wear-resistant layers 121, 122 may have a modulus of elasticity which is in a range between 300 and 350 GPa, and further may have a hardness which is greater than 30 GPa.

An adhesion layer 130 can be deposited between the surface of the tool 110 and the wear-resistant coating 120. Such an adhesion layer 130 can be used for improving adhesion between the surface of the tool 110 to be coated and the wear-resistant coating 120. The adhesion layer 130 can be provided having elastic modulus and hardness in a different value range than the layers (or the layer) forming the wear-resistant coating 120.

If an adhesion layer 130 is provided, the thickness of the adhesion layer should preferably not exceed 1 μm. Furthermore, if using an adhesion layer 130, the thickness of the adhesion layer 130 should preferably not exceed the thickness of the wear-resistant coating 120.

Figure 5:
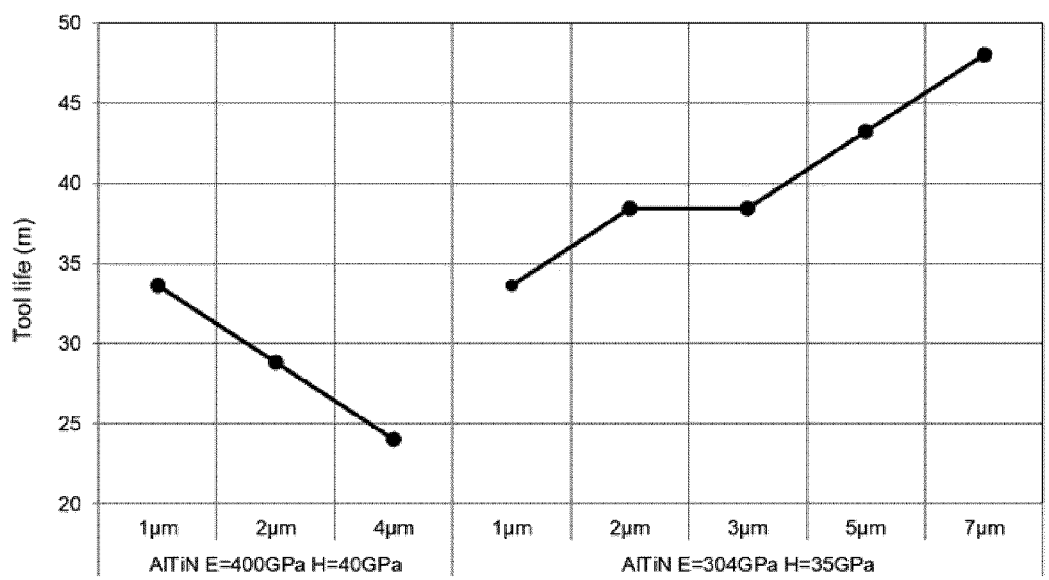

The attained tool service life of end milling tools coated with non-inventive coatings according to Example 1 as well as the attained tool service life of end milling tools coated with inventive coatings according to Example 2 are shown in FIG. 5.

For generating the results presented in FIG. 5 the end milling tools 100 coated with wear-resistant coatings 120 having different coating thicknesses according to the Examples 1 and 2 as described above, were tested in cutting tests by using following set of cutting test parameters:
Workpiece material: 1.4571 SUS316Ti
Kind of tool: End-mill having diameter d=10 mm
Cutting parameters: Vc=110 m/min, $f_t$=0.04 mm, ap=8 mm, ae=4 mm, wet conditions FIG. 5 (on the right) shows how the AlTiN coatings produced according to the inventive Example 2 lead to increased tool life, when these coatings are used as wear-resistant coatings for end milling tools during machining of 1.4571 SUS316Ti, which is a difficult material to cut. Furthermore, it can be observed that the higher the wear-resistant coating thicknesses the higher the attained tool life.

FIG. 5 (on the left) shows also that contrariwise, the non-inventive AlTiN coatings do not lead to an increased tool life. For these non-inventive wear-resistant coatings, the effect of the coating thickness is completely the opposite, i.e. the higher wear-resistant coating thicknesses the lower tool life.

From the results displayed in FIG. 5, it can be concluded that for machining, in particular cutting operations, in which adhesive wear is dominating (like machining—in particular end-milling—of stainless steel or Inconel machining), it is possible to increase considerably the tool performance and hence the tool service life by increasing wear resistant coating thickness. However, a higher wear resistant coating thickness can be beneficial only if the wear resistant coating is provided according to the present invention. In other words, only if the wear resistant coating 120 is provided having values of elastic modulus and hardness within the inventive ranges as mentioned above.

The inventor found that surprisingly the coating properties of the wear resistant layer 120 regarding for example chemical composition, (poly)crystalline structure and (variable) texture can be varied for attaining further additional benefits, but the above described effect will be provided by maintaining a combination of elastic modulus and hardness in the inventive range as described above and claimed in claim 1 of the present patent application, i.e. 300 GPa≤E<350 GPa and H>30 GPa. Thus, the same trends can also observed for other coating materials, in particular AlCrN, TiSiN and combinations of layers containing at least two metals and/or at least one nitride layer or at least one carbonitride layer or at least one carboxynitride layer or at least one oxynitride layer.

According to a preferred embodiment of the present invention, the wear-resistant coating 120 may have a crystalline or polycrystalline structure. Alternatively or in addition, the wear-resistant coating 120 may have a variable texture and/or exhibit a cubic phase.

According to a preferred embodiment of the present invention, the wear-resistant coating 120 comprises at least one layer consisting of AlTiN or mainly comprising AlTiN.

According to a preferred embodiment of the present invention, the wear-resistant coating 120 comprises at least two wear-resistant layers 121, 122, wherein one layer of the two layers consists of AlTiN or mainly comprises AlTiN and the other one layer consists of TiSiN or mainly comprises TiSiN. Also, the wear-resistant coating 120 may comprise two or more wear-resistant layers 121, 122, wherein at least two of the two or more wear-resistant layers 121, 122 are made of materials having the same elements and same chemical composition but differing in mechanical properties such as modulus of elasticity and/or hardness. Alternatively or in addition, the wear-resistant coating 120 may comprise two or more layers 121, 122, wherein at least two of the two or more wear-resistant layers 121, 122 are made of different materials. According to a further preferred embodiment of the present invention, the wear-resistant coating 120 comprises two or more layers 121, 122 differing in at least one of the material properties comprised in the following group: chemical composition, crystalline structure and texture.

According to a further preferred embodiment of the present invention, the thickness of the wear-resistant coating is between 0.5 μm and 20 μm, for example between 1 μm and 7 μm as shown in FIG. 3, maybe preferably between 5 and 20 μm.

Desired coating properties regarding combination of E-Modulus and Hardness according to the present invention can be achieved by selecting the appropriate combination of coating parameters depending of the kind of coating process that is intended to be used.

The inventor found that for example in the case of deposition of AlTiN coatings, the selection of an appropriate combination of bias voltage and substrate temperature has a big influence on the attained combination of E-modulus and hardness. The appropriate combination of coating parameters for depositing AlTiN coatings according to the present will however also depend on the Al-content.

In FIG. 6 it is possible to observe the wear behavior of tools 100 coated according to representative examples according the present invention, which exhibit a combination of hardness higher than 30 GPa and an elastic modulus as indicated in FIG. 6 (vertical axis—indicator scale on the left). The coated tools were tested by machining of stainless steel. The wear was measured from wear pictures after 24 m cutting distance.

For generating the results presented in FIG. 6, following set of cutting parameters were used:
Workpiece material: 1.4571 SUS316Ti
Kind of tool: End-mill with diameter d=10 mm
Cutting parameters: Vc=110 m/min, $f_t$=0.04 mm, ap=8 mm, ae=4 mm, wet conditions These obtained results are only representative examples. The same trends were also observed for other coating materials, in particular AlCrN, TiSiN and combinations of layers containing at least two metals and/or at least one nitride layer or at least one carbonitride layer or at least one carboxynitride layer or at least one oxynitride layer. Also, other deposition processes, workpiece materials and layer systems could be used.

In FIG. 7 it is possible to observe the wear behaviour of a representative example of tools coated according to the present invention, which exhibit a combination of hardness higher than 30 GPa and an elastic modulus as indicated in FIG. 7 (vertical axis—indicator scale on the left). The coated tools were tested by machining of Inconel. The wear was measured after 6.8 m cutting distance. For generating the results presented in FIG. 7, following set of cutting parameters were used:

Workpiece material: Inconel 718
Kind of tool: End-mill with diameter d=10 mm
Cutting parameters: Vc=50 m/min, ft=0.06 mm, ap=5 mm, ae=0.5 mm, wet conditions These obtained results are only representative examples. The same trends were also observed for other coating materials, in particular AlCrN, TiSiN and combinations of layers containing at least two metals and/or at least one nitride layer or at least one carbonitride layer or at least one carboxynitride layer or at least one oxynitride layer. Also, other deposition processes, workpiece materials and layer systems could be used.

The preceding explanation of the forms of execution describes the present invention exclusively in the context of examples. Of course, individual features of the design forms can be freely combined with each other, if technically reasonable, without leaving the scope of the present invention.

The invention claimed is:

1. A tool for machining workpieces, the tool comprising a surface which is at least partially covered by a PVD deposited wear-resistant coating,
said wear resistant coating comprising two or more wear-resistant layers, the wear-resistant coating having a modulus of elasticity, E, which is in a range $300\text{ GPa} \leq E < 350\text{ GPa}$, and further having a hardness, which is greater than 30 GPa, wherein at least one of the two or more wear-resistant layers is an aluminium titanium nitride layer (AlTiN layer) having chemical composition in atomic percentage $Al_xTi_{1-x}N$ with x in the range $0.5 < x \leq 0.9$, wherein at least two of the two or more wear-resistant layers are made of materials having the same elements and same chemical composition but differing in mechanical properties.

2. The tool according to claim 1, wherein each one of the wear-resistant layers has a modulus of elasticity, E, which is in the range $300\text{ GPa} \leq E < 350\text{ GPa}$, and further has a hardness, H, which is greater than 30 GPa.

3. The tool according to claim 1, wherein an adhesive layer is applied between the surface and the wear-resistant coating, wherein the adhesive layer improves the adhesion of the wear-resistant coating to the surface and has an adhesion layer thickness between 10 nm and 1 µm.

4. The tool according to claim 1, wherein the wear-resistant coating comprises two or more wear-resistant layers that are made of materials having the same elements but differing in chemical composition.

5. The tool according to claim 1, wherein the wear-resistant coating comprises two or more wear-resistant layers that are made of different materials.

6. The tool according to claim 1, wherein the wear-resistant coating comprises:
at least one TiSiN layer, or
at least one AlCrN layer.

7. The tool according to claim 1, wherein the wear-resistant coating comprises at least one carbonitride layer or at least one carboxynitride layer or at least one oxynitride layer.

8. The tool according to claim 1, wherein the wear-resistant coating has a layer thickness of 0.5 to 20 µm.

9. The tool according to claim 1, wherein the wear-resistant coating has a crystalline or polycrystalline structure.

10. The tool according to claim 9, wherein the wear-resistant coating has a variable texture.

11. The tool according to claim 1, wherein the wear-resistant coating comprises at least one wear-resistant layer exhibiting cubic phase.

12. The tool according to claim 3, wherein the adhesive layer is deposited with the aid of a physical gas-phase deposition.

13. The tool according to claim 1, wherein the wear-resistant coating consists of nitride layers.

14. The tool according to claim 1, wherein the wear-resistant coating comprises two or more wear-resistant layers that differ in at least one of elasticity or hardness.

* * * * *